United States Patent
Moura et al.

(10) Patent No.: US 7,891,936 B2
(45) Date of Patent: Feb. 22, 2011

(54) HIGH SPEED SUBSTRATE ALIGNER APPARATUS

(75) Inventors: Jairo Terra Moura, Marlboro, MA (US); Martin Hosek, Lowell, MA (US); Todd Bottomley, Chesterfield, NH (US); Ulysses Gilchrist, Reading, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 924 days.

(21) Appl. No.: 11/093,479

(22) Filed: Mar. 30, 2005

(65) Prior Publication Data

US 2006/0245846 A1 Nov. 2, 2006

(51) Int. Cl.
*H01L 21/68* (2006.01)

(52) U.S. Cl. ........................ 414/783; 414/217; 414/936; 414/941

(58) Field of Classification Search ................ 414/217, 414/783, 936, 941
See application file for complete search history.

(56) References Cited

U.S. PATENT DOCUMENTS

| | | | | |
|---|---|---|---|---|
| 4,915,564 A | | 4/1990 | Eror et al. ................... 414/217 |
| 5,102,280 A | * | 4/1992 | Poduje et al. ............. 414/744.5 |
| 5,339,027 A | * | 8/1994 | Woith et al. ................. 324/754 |
| 5,491,618 A | | 2/1996 | Vakil .......................... 362/147 |
| 5,568,969 A | | 10/1996 | Yu .............................. 362/404 |
| 5,970,818 A | | 10/1999 | Kikuchi et al. ................ 74/526 |
| 6,126,380 A | * | 10/2000 | Hillman ................... 414/744.6 |
| 6,126,381 A | * | 10/2000 | Bacchi et al. ................ 414/754 |
| 6,435,807 B1 | * | 8/2002 | Todorov et al. ............. 414/757 |
| 6,439,740 B1 | | 8/2002 | Yan ............................ 362/216 |
| 6,494,589 B1 | | 12/2002 | Shyu ............................ 362/96 |
| 6,530,732 B1 | | 3/2003 | Theriault et al. ............ 414/217 |
| 6,669,159 B1 | | 12/2003 | Hsu .............................. 248/343 |
| 7,019,817 B2 | * | 3/2006 | Hashimoto et al. ............. 355/72 |
| 2002/0048506 A1 | * | 4/2002 | Babbs et al. ................. 414/783 |
| 2003/0053904 A1 | * | 3/2003 | Kirihata et al. ............. 414/783 |
| 2003/0062578 A1 | * | 4/2003 | Dougan et al. ............... 257/414 |
| 2003/0180127 A1 | * | 9/2003 | Kuroda ....................... 414/217 |
| 2005/0016818 A1 | * | 1/2005 | Ito et al. ..................... 414/936 |
| 2005/0099817 A1 | | 5/2005 | Lin ............................. 362/404 |

* cited by examiner

*Primary Examiner*—Michael S Lowe
(74) *Attorney, Agent, or Firm*—Perman & Green, LLP; Richard Pickreign (57) ABSTRACT

A substrate aligner providing minimal substrate transporter extend and retract motions to quickly align substrate without back side damage while increasing the throughput of substrate processing. In one embodiment, the aligner having an inverted chuck connected to a frame with a substrate transfer system capable of transferring substrate from chuck to transporter without rotationally repositioning substrate. The inverted chuck eliminates aligner obstruction of substrate fiducials and along with the transfer system, allows transporter to remain within the frame during alignment. In another embodiment, the aligner has a rotatable sensor head connected to a frame and a substrate support with transparent rest pads for supporting the substrate during alignment so transporter can remain within the frame during alignment. Substrate alignment is performed independent of fiducial placement on support pads. In other embodiments the substrate support employs a buffer system for buffering substrate inside the apparatus allowing for fast swapping of substrates.

11 Claims, 9 Drawing Sheets

HIGH SPEED SUBSTRATE ALIGNER APPARATUS

BACKGROUND

1. Field of the Invention

The present invention relates to a substrate aligner apparatus.

2. Brief Description of Related Developments

Integrated circuits (IC) are produced from substrates (wafers) of semiconductor material. During IC fabrication wafers are typically housed in cassettes and moved to processing stations where the wafers are removed from the cassette via a substrate transporter and placed in a wafer aligner to effect a predetermined orientation that is desired for further processing of the wafer.

In conventional aligners, the substrate transporter may place the wafer on the wafer aligner and then move away from the aligner during the wafer alignment process. This results in increased wafer alignment times arising from the substrate transporter extension and retraction before and after the wafer alignment process. Also, if the alignment feature or fiducial of the wafer is placed over an aligner feature, such as the alignment chuck rest pads, masking the wafer fiducial from the fiducial sensor of the aligner, this will result in wafer placement and fiducial sensing re-tries, thereby further adding to the alignment time. Both the repeated movements of the substrate transporter during the alignment process and the obstruction of the wafer alignment feature create inefficiencies in the alignment process thereby decreasing the throughput of wafer processing and production.

Due to potential substrate transporter re-tries in placing the wafer on the aligner and the large numbers of wafers processed through the aligner, the time that is needed to align a batch of wafers for processing can increase substantially. Table 1 below illustrates a conventional alignment process with a conventional substrate aligner.

TABLE 1

| Pass Number | Description | Estimated Time (sec) |
| --- | --- | --- |
| 1 | Transporter extends to aligner | 1.0 |
| 2 | Places the wafer on the aligner chuck | 0.8 |
| 3 | Transporter partially retracts | 0.5 |
| 4 | Aligner scans 360 degrees for fiducial | 1.5 |
| 5 | If fiducial is not found (i.e. covered by the chuck pads) a retry is needed | — |
| 6 | Chuck goes to safe zone to clear the path for the transporter end effector | 0.4 |
| 7 | Transporter extends | 0.5 |
| 8 | Transporter lifts the wafer (no end effector edge grip actuation) | 0.3 |
| 9 | Aligner rotates chuck slightly towards the safe zone to uncover the notch | 0.2 |
| 10 | Transporter drops the wafer on chuck | 0.3 |
| 11 | Transporter retracts partially | 0.5 |
| 12 | Aligner scans 360 deg. for fiducial and finds that at the post position the transporter pick path is obstructed | 1.5 |
| 13 | Transporter extends | 0.5 |
| 14 | Transporter lifts the wafer | 0.3 |
| 15 | Aligner moves the chuck to within the safe zone | 0.4 |

TABLE 1-continued

| Pass Number | Description | Estimated Time (sec) |
| --- | --- | --- |
| 16 | Transporter drops the wafer on chuck | 0.3 |
| 17 | Aligner moves the chuck as close as possible to the desired post-position and the chuck within the safe zone | 0.2 |
| 18 | Repeat items 14–17 until the fiducial is at the desired post-position and the chuck within the safe zone | — |
| 19 | Transporter lifts and grips the wafer | 0.8 |
| 20 | Transporter retracts to home | 1.0 |
| Total Time | | >11 |

In addition to, the increased alignment times, wafer walking may be induced into the alignment process as a result of the repeated lifting and placing of the wafer to and from the alignment chuck. Further, each additional pick of the wafer increases the possibility of backside damage or contamination.

With conventional aligner designs it is not possible to reliably detect the fiducial when it is placed on top of the chuck pad due to the use of a through beam sensor. It is also not possible to arbitrarily orient the wafer without obstructing the pick path of the substrate transporter nor is it guaranteed that the wafer be aligned in less than two substrate transporter re-tries. The number of re-tries needed to properly align the wafer with conventional aligners also jeopardizes the accuracy of the fiducial post position. In addition, the alignment of the wafer cannot be performed with the substrate transporter extended under the aligner, thus requiring additional extend/retract motions by the substrate transporter for each alignment operation performed.

U.S. Pat. No. 6,468,022 B1 and U.S. Pat. No. 6,357,996 B2 disclose examples of conventional substrate aligners that utilize edge rolling for wafer fiducial detection and expensive edge sensing devices.

The exemplary embodiments of the present invention overcome the problems of conventional wafer aligners as will be described further below.

SUMMARY OF THE EXEMPLARY EMBODIMENTS

In accordance with one exemplary embodiment of the present invention a substrate aligner apparatus is provided comprising a frame, an inverted chuck, a sensing device and a substrate transfer mechanism. The frame is adapted to allow a substrate transporter to transport a substrate to and from the aligner apparatus. The inverted chuck is capable of holding the substrate and is movably connected to the frame by a chuck driveshaft engaged to the inverted chuck for moving the inverted chuck relative to the frame and effecting alignment of the substrate. The sensing device, for detecting a position determining feature of the substrate, is located between the chuck and the chuck driveshaft. The substrate transfer mechanism is movably connected to the frame and is located inside the frame below the inverted chuck for moving the substrate from the inverted chuck to the substrate transporter.

In accordance with another exemplary embodiment of the present invention a substrate aligner apparatus is provided comprising a frame and an edge gripping chuck system. The frame is adapted to allow an edge gripping substrate transporter to transport a substrate to and from the aligner apparatus. The edge gripping chuck system is connected to the frame for holding and rotationally positioning the substrate to a predetermined post alignment substrate orientation. The chuck system is configured to effect the predetermined post alignment substrate orientation independent of the substrate transporter so that regardless of the predetermined post alignment substrate orientation relative to the transporter, post alignment transfer of the substrate to the transporter can be effected without rotational repositioning of the substrate.

In accordance with another exemplary embodiment of the present invention a substrate aligner apparatus is provided comprising a frame, a rotatable sensor head and a substrate support. The frame is adapted to allow a substrate transporter to transport a substrate to and from the aligner apparatus. The rotatable sensor head has at least one sensing device for detecting a position determining feature of the substrate and is movably connected to the frame by a driveshaft engaged to the rotatable sensor head for moving the rotatable sensor head relative to the frame. The substrate support is mounted to the frame for supporting the substrate when the position determining feature is detected by the rotatable sensor head. The substrate support has support pads contacting a peripheral edge of the substrate and the sensing device is capable of detecting the position determining feature independent of the location of the position determining feature relative to the support pads.

In accordance with still another exemplary embodiment of the present invention a substrate aligner apparatus is provided comprising a frame, a drive section connected to the frame, a first substrate interface and a second substrate interface. The frame is adapted to allow a substrate transporter to transport a substrate to and from the aligner apparatus. The first substrate interface section is movably connected to the frame for directly interfacing with the substrate and operably connected to the drive section for effecting movement of the first substrate interface section relative to the frame. The second substrate interface section is movably connected to the frame for directly interfacing with the substrate and operably connected to the drive section for effecting movement of the second substrate interface section relative to the frame. The first substrate interface section is moved for effecting detection of a position determining feature of the substrate, and the second substrate interface is moved for effecting repositioning of the substrate.

BRIEF DESCRIPTION OF THE DRAWINGS

The foregoing aspects and other features of the present invention are explained in the following description, taken in connection with the accompanying drawings, wherein.

DETAILED DESCRIPTION OF THE EXEMPLARY EMBODIMENTS

Although the present invention will be described with reference to the exemplary embodiments shown in the drawings and described below, it should be understood that the present invention can be embodied in many alternate forms of embodiments. In addition, any suitable size, shape or type of elements or materials could be used.

Figure 1:
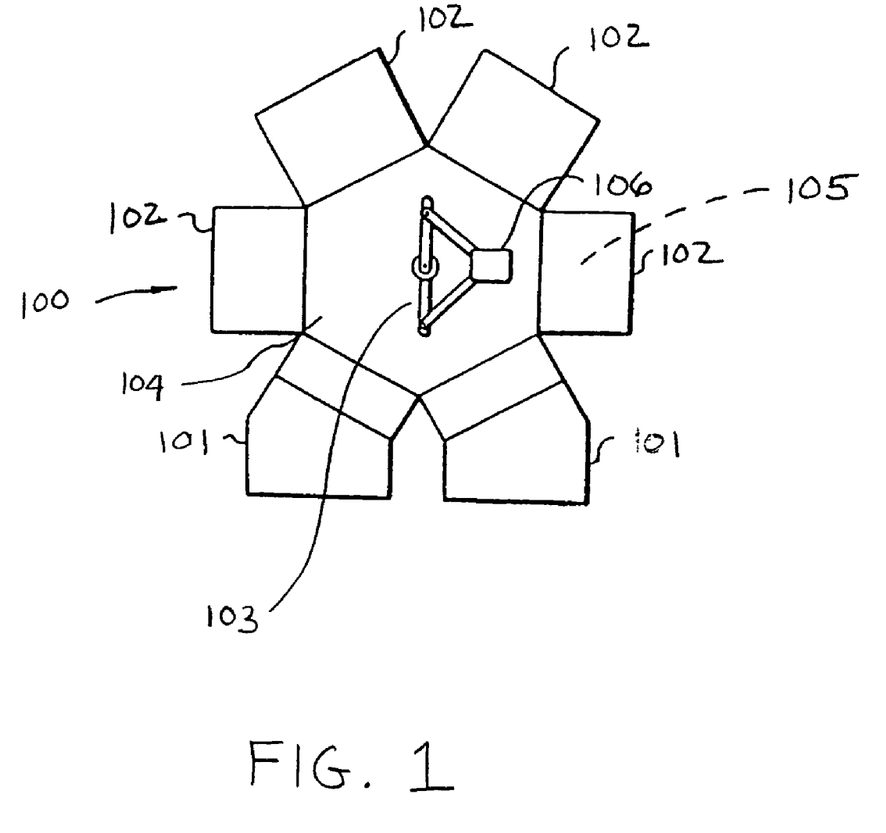
FIG. 1 is a schematic top plan view of a substrate processing apparatus incorporating features in accordance with an exemplary embodiment of the present invention.

Referring to FIG. 1, there is shown a schematic top plan view of a semiconductor substrate processing apparatus 100 incorporating features of the present invention. The processing apparatus shown in FIG. 1 is a representative processing apparatus with multiple substrate processing chambers 102. At least one of the processing chambers 102 has a substrate aligner apparatus 105. In addition to the multiple substrate processing chambers 102, which may be connected to a transfer chamber 104, the substrate processing apparatus 100 may include substrate cassette holders 101 that are also connected to the chamber 104. A substrate transporter 103 is also located, at least partially, in the chamber 104 and is adapted to transport substrates, such as semiconductor wafers, between and/or among the substrate processing chambers 102 and the cassette holders 101. The substrate transporter 103 has an end effector (substrate holder) 106 for holding the substrate. The substrate transporter 103 shown in FIG. 1 is exemplary and may have any other suitable arrangement. Examples of substrate transporters that may be used in the processing apparatus 100 may be found in U.S. Pat. No. 6,485,250 B2, U.S. Pat. No. 6,231,297, U.S. Pat. No. 5,765,983 and U.S. Pat. No. 5,577,879 all of which are incorporated herein by reference in their entirety. The substrate transporter may be of the scara type or it may have multiple linkages effecting the linear movement of the end effector. The substrate transporter 103 may have one or more end effectors 106, each capable of holding one or more wafers. The end effector 106 may also be an edge gripping or vacuum gripping end effector. In alternate embodiments, the substrate processing apparatus 100 may have any other desired configuration with any desired number of chambers.

Any suitable type of substrate may be processed in the semiconductor processing apparatus 100 and by the aligner 105 such as semiconductor wafers having a diameter of 200 mm or 300 mm. The semiconductor wafers generally have an alignment or reference mark (fiducial) 220 (See FIG. 3) for aligning the wafer according to a predetermined orientation.

In the case of integrated circuit production, the integrated circuits are produced from wafers of semiconductor material. The wafers may be housed in cassettes having one or more closely spaced slots, each slot capable of holding a wafer. The cassette may be placed on a first substrate cassette holder 101 for loading or unloading the apparatus 100. The substrate transporter 103 then grips a wafer with the end effector 106 and transports it to a substrate processing chamber 102 incorporating the substrate aligner apparatus 105.

The aligner apparatus 105 in one embodiment, as described below, generally has a frame, a chuck, a sensing device and a substrate transfer mechanism. The end effector 106 places the wafer on the aligner chuck where the wafer is rotated so that the sensing device can detect the position of the fiducial. The wafer is aligned to a predetermined position for subsequent processing. Post alignment, the wafer may be removed from the aligner by the substrate transporter end effector 106 and transported to other substrate processing chambers 102 for further processing. The substrate aligner 105 effects the detection and alignment of the fiducial independent of fiducial orientation and independent of the end effector 106 location within the aligner 105. Once the wafer is processed, the substrate may be placed in a cassette on the other substrate cassette holder 101.

Figure 2A:
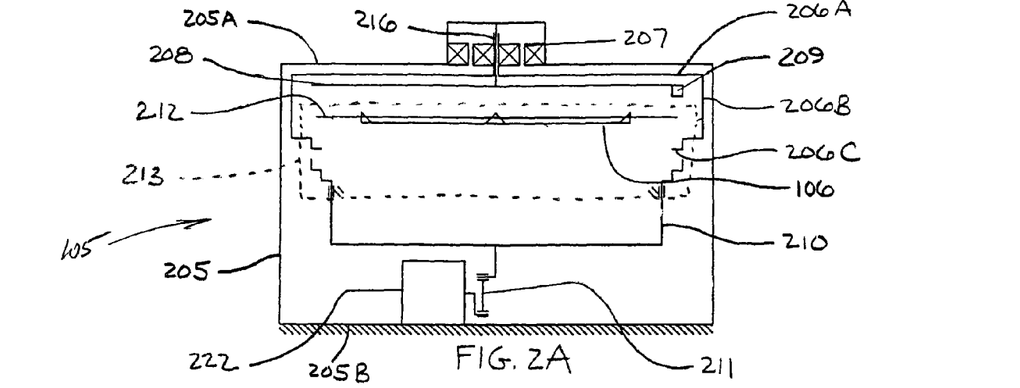
FIG. 2A is a schematic side view of a substrate aligning apparatus of the processing apparatus in FIG. 1 showing the aligner apparatus in a first configuration.
Figure 2B:
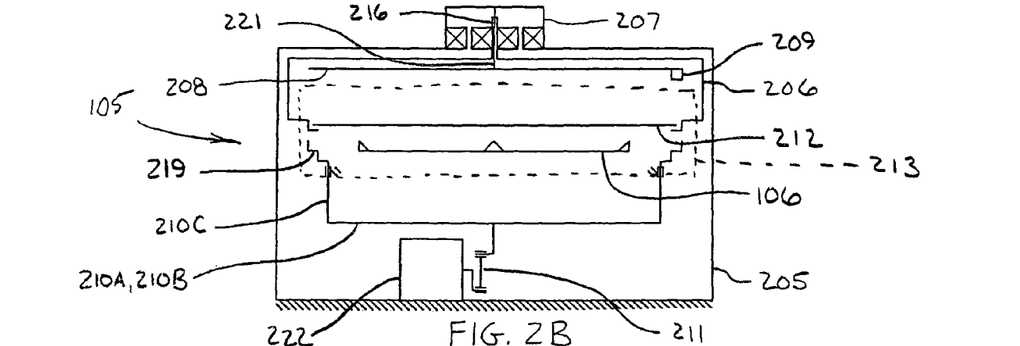
FIG. 2B is another schematic side view of the substrate aligning apparatus of the processing apparatus in FIG. 1 showing the apparatus in a second configuration.
Figure 2C:
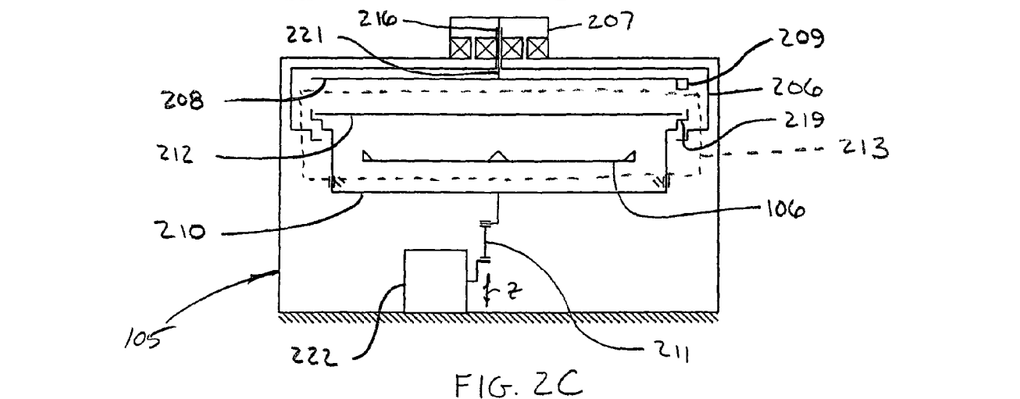
FIG. 2C is still another schematic side view of the substrate aligning apparatus of the processing apparatus in FIG. 1 showing the apparatus in a third configuration.

Referring now to FIGS. 2A-2C, in a first exemplary embodiment the substrate aligner apparatus 105 generally comprises a frame 205, an inverted chuck 206, an inverted chuck drive section 216 and drive system 207, a sensing device 209, a substrate transfer mechanism 210, and a transfer mechanism drive section 211 and drive system 222. In the exemplary embodiment shown in FIGS. 2A-2C, the frame 205 may have an opening, aperture or slot 213. Substrate transporter 103 (See FIG. 1) transports a substrate 212 (held on the transport end effector 106) into and out of the frame 205. Opening 213 thus allows the end effector 106 access to the substrate aligner apparatus 105.

Figure 3:
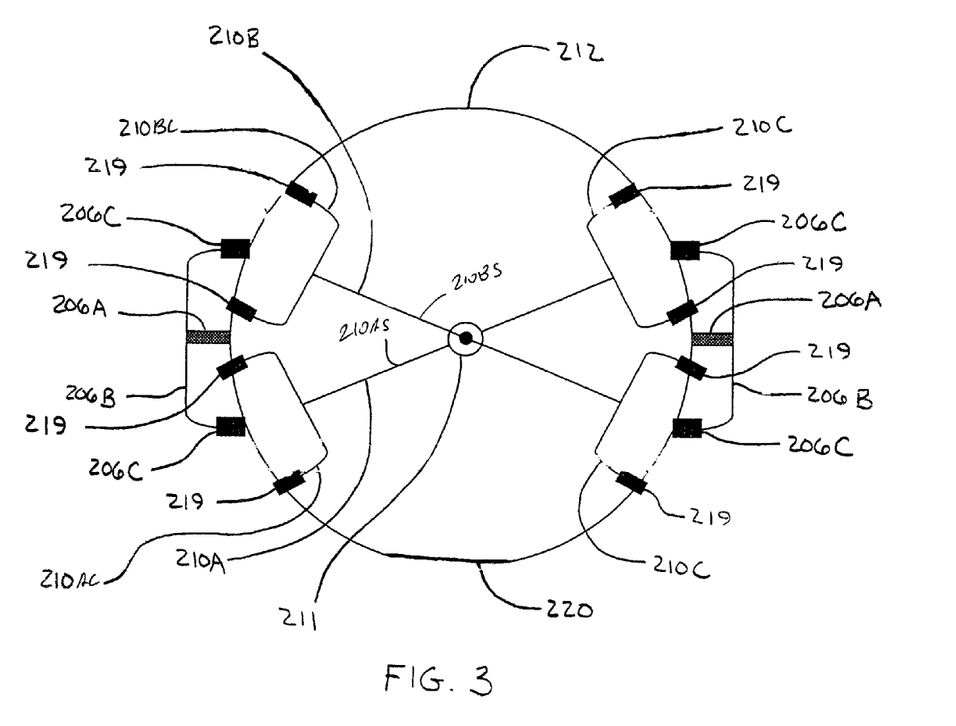
FIG. 3 is a schematic bottom view of an inverted chuck and substrate transfer mechanism of the substrate aligner apparatus in FIGS. 2A-2C.

In this exemplary embodiment, the inverted chuck 206 may be located proximate to the top 205A of frame 205. As shown in FIGS. 2A and 3, which respectively show a side view and bottom view of the substrate 212 and chuck 206, the chuck may have a span member 206A and downward extensions 206B depending therefrom. As shown best in FIGS. 2A-2C, the span member 206A and downward extensions 206B are looped above the substrate 212 and transporter end effector 106 when located within the frame 205. The span member 206A mates the chuck 206 to the drive section 216 of drive system 207 as will be described below. The span member 206A faces the top side of the substrate 212 while the downward extension members 206B extend downward from the span member 206A. Each downward extension member 206B has rest pads 206C for supporting substrate 212 when held by the chuck 206. Each extension member 206B extends down sufficiently from the span member 206A so that the rest pads 206C thereon are positioned to contact the peripheral edge of substrate 212 along the bottom side of the substrate 212 when the chuck 206 holds substrate 212. Thus, the downward extension members 206B reach around opposite sides of the substrate 212 from the span member 206A, from above the substrate, to engage the bottom region of the peripheral edge of the substrate 212. Hence chuck 206 is referred to herein as an inverted chuck. The rest pads 206C may be passive rest pads or alternatively, rest pads 206C may actively grip the substrate 212. In alternate embodiments the chuck may have any other suitable configuration.

The inverted chuck drive system 207, in this embodiment, is a rotary drive system located at the top 205A of the frame 205 and is mated with the inverted chuck 206 through drive section 216. Examples of motors that may be used in drive system 207 include stepper motors and servo motors. The motors may be brushless and may have an encoder to coordinate the alignment of substrate 212 with a signal transmitted by an optical sensor 209 corresponding to the detection of the wafer fiducial 220. The chuck drive system 207 is independent from the substrate transfer mechanism drive system 222. In alternate embodiments the chuck drive system 207 may be any other suitable configuration.

As seen in FIG. 2A, the substrate aligner apparatus 105 has a contamination shield 208. The contamination shield 208 is located near the top 205A of frame 205, between the drive section 216 of drive system 207, as well as the rotatable span portion 206A over the substrate, and the substrate 212 when the substrate is held by chuck 206. The shield 208 may be generally flat in shape and of a diameter such that it fits within the chuck 206, yet shields the entire substrate, when the chuck 206 is holding a 200 mm or 300 mm substrate 212. The shield may be fixed relative to the frame 205. As seen in FIG. 2A-2C, in this embodiment the shield 208 is attached to the frame so as not to interfere with rotation of the inverted chuck 206. In this embodiment, the shield 208 may be supported from a post 221 extending concentrically through the drive shaft 216 driving chuck 206. The shield may be made of any suitable material such as metal or plastic and may have any desired planform shape, such as substantially circular. In alternate embodiments the shield 208 may be of any other suitable configuration.

As shown in FIGS. 2A-2C, the aligner 105 has a sensing device 209 for detecting the substrate fiducial 220. In this embodiment the sensing device 209 is a reflective optical sensor. In alternate embodiments the sensor 209 may be any other suitable sensing device including capacitive and inductive sensors. In this embodiment, sensing device 209 may be mounted on contamination shield 208. In alternate embodiments the sensor 209 may be mounted in any other suitable manner so that the substrate 212, when held by the chuck 206, is in the sensing field of the sensor 209 and rotation of the inverted chuck 206 is unrestrained by the sensor 209 and its mount. Sensor 209 is positioned radially from the center of the chuck's 206 axis of rotation so that the peripheral edge of substrate 212 and its fiducial 220 are disposed in registry with the sensor 209 and so that the rotating chuck structure does not obstruct the sensing of the fiducial 220. Sensing device 209 may also be fixed from movement relative to the frame 205. In alternate embodiments the sensing device may have any other desired configuration.

Still referring to FIGS. 2A-2C and FIG. 3, the substrate transfer mechanism 210 of this embodiment is located under the chuck 206 in order to pick substrate 212 from the chuck and place the substrate 212 on the end effector 106. In this embodiment the transfer mechanism 210 may have multiple independently actuated lifters. Two lifters 210A, 210B are shown in FIG. 3 (In FIGS. 2A-2C, only one of the lifters 210A, 210B is shown for illustrative purposes). In alternate embodiments, the transfer mechanism 210 may have any number of lifters. In this embodiment, each of the two lifters are similar in configuration and have span members 210AS, 210BS and upward extensions 210AC, 210BC depending from opposite ends of the lifter span members 210AS, 210BS. The span members 210AS, 210BS mate the lifters 210A, 210B with the substrate transfer mechanism drive section 211 of the drive system 222 as described below. The span members 210AS, 210BS face the bottom of the substrate 212 when substrate 212 is held by chuck 206 while each of the upward extensions 210C extend up towards the bottom of substrate 212 when substrate 212 is held by chuck 206. Each of the upward extensions 210C has rest pads 219 for supporting substrate 212. Each rest pad 219 contacts the bottom peripheral edge of substrate 212. In alternate embodiments the substrate transfer mechanism 210 may have any other suitable configuration.

The substrate transfer mechanism drive system 222 is located at the bottom 205B of the frame 205. The drive system 222 is mated to the transfer mechanism 210 through drive section 211. In this exemplary embodiment, drive system 222 is a linear drive system capable of independently moving each lifter 210A, 210B back and forth along drive Axis Z (See FIGS. 2A-2C). Drive system 222 may for example be a ball-screw drive, a rod linear actuator or a slide linear actuator. In alternate embodiments drive system 222 may be of any other suitable configuration or drive type. The linear travel of the drive system 222 is sufficient for either lifter 210A, 210B to lift substrate 212 off chuck 206 when substrate 212 is held by chuck 206 and lower it onto end effector 106.

Figure 7:
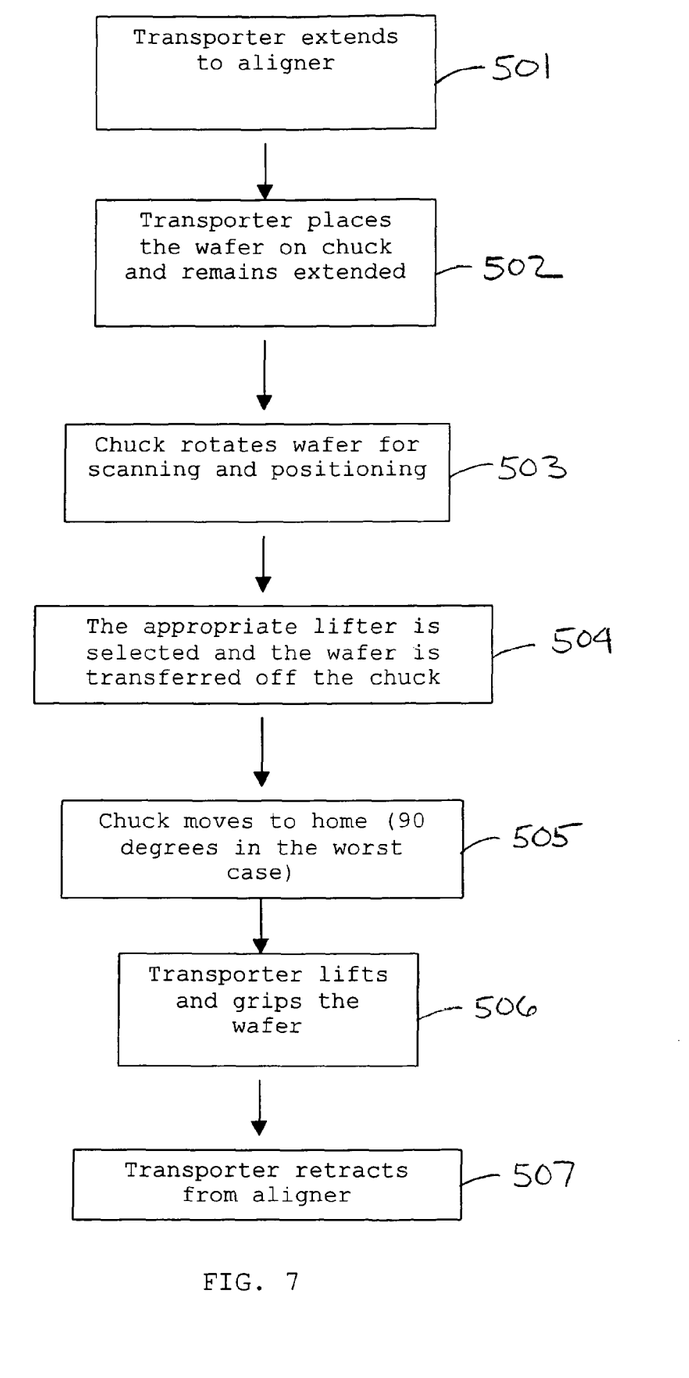
FIG. 7 is a flow chart showing a method for aligning a substrate in accordance with the aligner apparatus in FIGS. 2A-2C and FIG. 3.

Referring again to FIGS. 2A-2C and 3 and also referring to the flow chart in FIG. 7, the operation of substrate aligner apparatus 105 will be described. As indicated in Block 501 of FIG. 7, the substrate transporter end effector 106 enters the aligner above the chuck rest pads 206C through the opening in the frame 213 and places the substrate within the chuck 206 (See FIG. 2A). The end effector moves down below the chuck 206 thereby placing the substrate 212 onto the inverted chuck rest pads 206C, (See Block 502 of FIG. 7 and FIG. 2B). The end effector 106 if desired may remain extended between the inverted chuck 206 and transfer mechanism lifters 210A, 210B. The substrate transporter end effector 106 is able to remain within the frame 205 during alignment due to the configuration of the chuck 206 and transfer mechanism 210 as shown in FIGS. 2A-2C. The inverted chuck 206 grips the substrate 212 positioned thereon for alignment. The inverted chuck 206 is rotated, via the inverted chuck drive section 216 and drive system 207 (See Block 503 of FIG. 7). During rotation, the sensing device 209 senses the peripheral edge of the substrate 212 and detects the substrate alignment feature (fiducial) 220 on the edge of the substrate 212 as may be realized. During alignment the contamination shield 208 prevents any particles generated by the chuck 206 and chuck drive system 207, 216 from contaminating the surface of the substrate 212.

Sensing device 209 is able to detect the substrate fiducial 220 independent of its orientation relative to the gripping pads of chuck 206. For example, the chuck rest pads 206C grip the edge of the substrate 212, without masking the edge of its fiducial 220 and hence the fiducial 220 and wafer edge are always substantially exposed to sensing device 209. In addition, as noted before, sensing device 209 is capable of detecting the fiducial 220 from but one side (e.g. the top) of the substrate 212 so that obstructions or cover on the opposite side of the wafer does not degrade sensor performance. Detection of the substrate edge and fiducial 220 independent of position on the chuck 206 eliminates substrate placement re-tries on the chuck 206.

Once the sensing device 209 detects the substrate fiducial 220, a suitable indication signal is transmitted to a controller (not shown) to register the position of the substrate fiducial 220 relative to a desired reference frame. The sensing device 209 may also send suitable signals to the controller enabling the controller to determine substrate eccentricity with respect to a desired substrate center reference location. The controller may calculate chuck movement to achieve desired alignment orientation of the substrate 212 and send movement commands to drive 207. The inverted chuck 206 positions the substrate 212 to a desired alignment orientation (See Block 503 of FIG. 7). The appropriate lifting pad 210A, 210B is then selected to lift the post aligned substrate 212 off of the inverted chuck 206 (See Block 504 of FIG. 7). The lifting pads 210A, 210B are independently actuated and because of their configuration (See FIG. 3), at least one of the lifting pads 210A, 210B is capable of clearing obstructions from end effector structure and chuck structure regardless of chuck 206 orientation post substrate positioning to pick the post positioned substrate 212 from the chuck 206. Thus, transfer mechanism 210 can access the inverted chuck independent of the position of the substrate transporter end effector 106 within the aligner frame 205 and without rotationally repositioning the substrate 212 on the chuck 206. The lifting pads 210A, 210B lift the substrate 212 from the inverted chuck 206 and the inverted chuck 206 may return to its home position (See Blocks 504-505 of FIG. 7). The substrate transporter end effector 106 picks the substrate off the lifting pad 210A, 210B, grips the wafer (substrate) 212 and delivers the substrate 212 to be processed further (See Blocks 506-507 of FIG. 7). It is noted that the controller may position the end effector 106 so that picking the substrate from the lifting pads 210A, 210B also effects correction of eccentricity misalignment. Table 2 below summarizes the exemplary process described above (as graphically depicted in FIG. 7) and illustrates at a glance the improved efficiencies provided over conventional aligners. Table 2 also identifies exemplary times corresponding to each of the operations performed to align a substrate using this exemplary embodiment.

TABLE 2

| Pass Number | Description | Estimated Time (sec) |
| --- | --- | --- |
| 1 | Transporter extends to aligner | 1.0 |
| 2 | Transporter places the wafer on chuck and remains extended | 0.8 |
| 3 | Aligner scans and post positions wafer | 1.5 |
| 4 | The appropriate set of pads is selected and the wafer is lifted | 0.5 |
| 5 | Chuck moves to home (90 degrees in the worst case) | 0.2 |
| 6 | Transporter lifts and grips the wafer | 0.8 |
| 7 | Transporter retracts to home | 1.0 |
| Total time | | 5.8 |

As can be seen by comparison to Table 1, the aligner 105 in the exemplary embodiment shown in FIGS. 2A-3 and FIG. 7 is capable of significantly reducing the alignment time to align a substrate over the at least eleven second alignment time of the prior art as described in the background section above.

Figure 4:
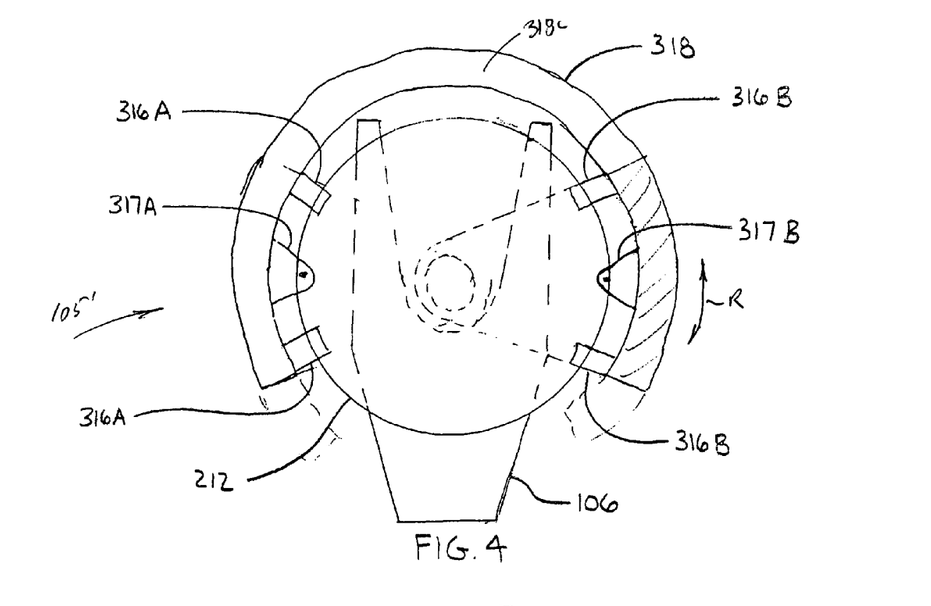
FIG. 4 is a schematic top view of a substrate aligner apparatus in accordance with another exemplary embodiment of the present invention.
Figure 5:
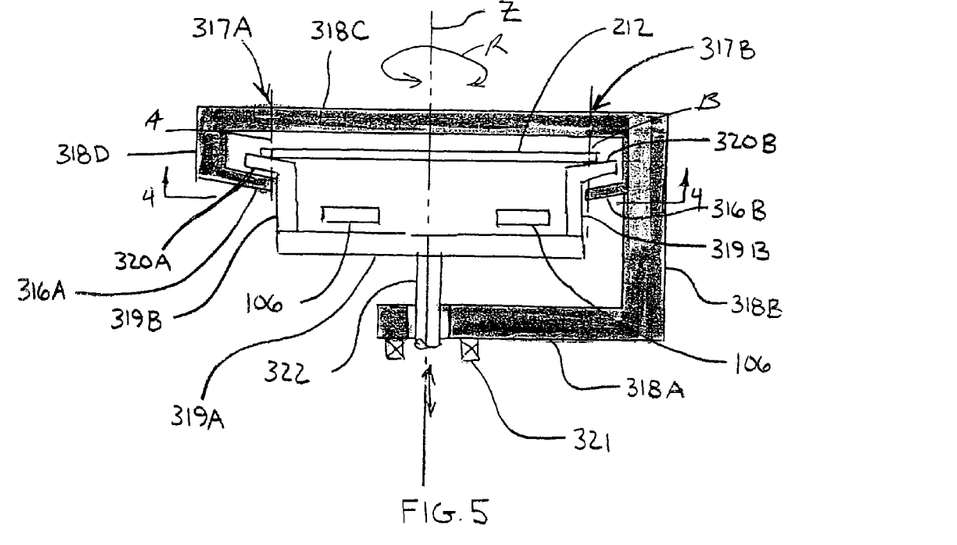
FIG. 5 is a side view of the substrate aligner apparatus in FIG. 4.

Referring now to FIGS. 4 and 5, in a second exemplary embodiment the substrate aligner apparatus 105' generally comprises a frame (not shown), a rotatable sensor head 318 with at least one sensing device 317, and a substrate support 319. The frame (not shown) is similar to the frame 205 (See FIGS. 2A-2C) in the first embodiment of the substrate aligner apparatus 105 described before unless otherwise noted. The rotatable sensor head 318 has a base member 318A located, for example, towards the bottom of the frame and below the end effector 106 when the end effector 106 is inside the frame. The end effector 106 may access the frame through an opening similar to opening 213 in FIGS. 2A-2C. The base member 318A is connected to a drive section 321 of the sensor head drive system (not shown) as will be described below. The base member 318A extends radially from the rotatable sensor head's 318 axis of rotation, Axis Z, as shown in FIG. 5. Base member 318A has a base extension member 318B depending therefrom on but one side of the base member 318A in this embodiment. The base extension member 318B extends upward toward the top of the frame from base member 318A above the substrate 212 when held by the substrate support 319. Base extension member 318B has a span member 318C depending therefrom. Span member 318C may be arcuate in shape and extends above substrate 212 to the opposite side from the base extension member 318B. As seen best in FIG. 4, the arcuate shape of span member 318C leaves a distance between the perimeter of the substrate 212 and span member 318C so that the span member 318C does not overhang the substrate 212. In alternate embodiments the span member 318C may have any other desired shape. As seen in FIG. 5, the span member 318C has a downward extension member 318D depending therefrom on the side opposite the base extension member 318B. Thus, as best shown in FIG. 5 the base extension member 318B, the span member 318C and the downward extension member 318D wrap around the substrate support system 319 and the substrate 212 from the base member 318A. In this exemplary embodiment the rotatable sensor head 318 also has substrate supports 316A, 316B located on opposite sides of the sensor head 318. Substrate supports 316A depend from the downward extension member 318D while substrate supports 316B depend from the base extension member 318B as shown in FIGS. 4 and 5. Substrate supports 316A, 316B wrap around the underside of substrate 212 from the downward extension member 318D and the base extension member 318B so that the substrate supports 316A, 316B contact the bottom peripheral edge of substrate 212 when substrate 212 is held by the sensor head 318 as will be described below. The substrate supports 316A, 316B may be passive or active gripping. In alternate embodiments the rotatable sensor head 318 may have any other desired configuration.

In this exemplary embodiment, sensor head 318 may have two sensing devices 317A, 317B located on opposite sides of sensor head 318 as shown in FIGS. 4 and 5. In alternate embodiments the sensor head 318 may have more or less than two sensors. Sensing devices 317A, 317B may be reflective optical sensors or through beam optical sensors. In alternate embodiments the sensing devices 317A, 317B may be capacitive or inductive sensing devices. Sensors 317A, 317B are radially positioned from the center of rotation, Axis Z, a sufficient distance so that the sensors 317A, 317B are capable of sensing the peripheral edge of substrate 212.

The sensor head drive system (not shown) is mated to the sensor head through drive section 321 and is similar to the rotary drive described before with respect to aligner 105. However, in this embodiment the drive system is located at the bottom of the frame and rotates the sensor head around Axis Z as shown in FIG. 5. In alternate embodiments the drive system may be of any other desired configuration.

As seen in FIG. 5, the substrate support system 319 in this exemplary embodiment is nested between the sensor head span member 318C and the sensor head base member 318A. The substrate support system has a span member 319A whose center is located substantially coincident with Axis Z and mated to a substrate support drive member 322, also located along Axis Z. Substrate support drive member 322 is part of the substrate support drive system (not shown) as described below. In this embodiment, the span member 319A has two upward extension members 319B depending on opposite sides therefrom. In alternate embodiments there may be any number of upward extension members depending from the span member 319A. The span member 319A faces the bottom of the substrate 212 when held by the support 319. The upward extension members 319B have rest pads 320A, 320B that overlap at least in part the sensor head devices 317A, 317B of sensor head 318 (See FIG. 5). The substrate support rest pads 320A, 320B are configured to support the bottom peripheral edge of substrate 212. Rest pads 320A, 320B may actively or passively grip substrate 212. Rest pads 320A, 320B or at least a portion thereof in way of sensor devices 317A, 317B may also be made of a transparent material so that a beam A, B of radiation from sensors 317A, 317B, capable of detecting the edge of the substrate 212 when seated on rest pads 320A, 320B, passes through the portion of the rest pads 320A, 320B in way of beam A, B to the sensor receiver (not shown) so as to be able to detect the edge of the substrate 212 and the fiducial 220 on the edge. The material for the rest pads 320A, 320B may for example be quartz, optically transparent to light beams, or any other suitable material. In alternate embodiments, when a sensor such as a reflective sensor is used, the rest pads 320A, 320B may be of a non-transparent material. In alternate embodiments, the substrate support system 319 may have any other desired configuration.

The substrate support drive system (not shown) is similar to the linear drive system 211, 222 described before and shown in FIGS. 2A-2C, unless otherwise noted. The substrate support drive system mates with the substrate support system 319 through the substrate support drive member 322. The substrate support drive system in this embodiment transfers the substrate 212 back and forth along Axis Z. The drive system is capable of moving the support system 319 from a position where the rest pads 320A, 320B are located above sensor head rest pads 316A, 316B (See FIG. 5) to a position where the rest pads 320A, 320B are below sensor head rest pads 316A, 316B. In this embodiment the substrate support system is not capable of rotation but in alternate embodiments the substrate support drive system may be combined with a rotational drive so that the substrate support system not only travels along Axis Z but rotates about Axis Z as well.

Figure 8:
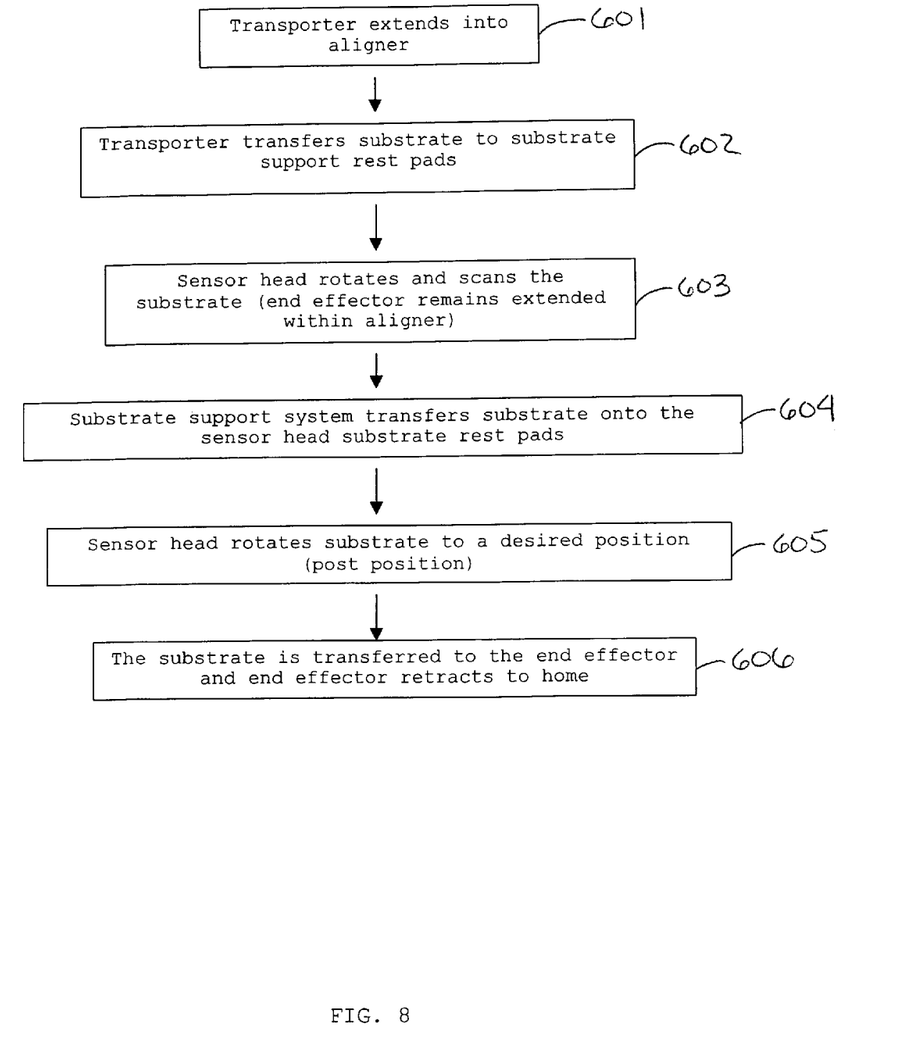
FIG. 8 is a flow chart showing a method for aligning a substrate in accordance with the aligner apparatus in FIGS. 4 and 5.

Still referring to FIGS. 4 and 5 and also referring to the flow chart in FIG. 8, the operation of the substrate aligner apparatus 105' will be described. The substrate transporter end effector 106 enters the aligner between the sensor head span member 318C and sensor head substrate supports 316A, 316B through the opening in the frame (similar to opening 213 in FIG. 2A) (See Block 601 in FIG. 8) and places the substrate on the support pads 320A, 320B of support system 319 about Axis Z. The substrate support system 319 may move up along Axis Z to the position shown in FIG. 5 to enable the end effector 106 to place substrate 212 onto the substrate support rest pads 320A, 320B (See Block 602 in FIG. 8). The end effector 106 may move down along Axis Z, to a position below support pads 320A, 320B and above the support system span member 319A so that its location is within substrate support 319 as best shown in FIG. 5. The end effector 106 may remain extended under the substrate 212. As noted in Block 603 of FIG. 8, in order to scan the substrate 212, the rotatable sensor head 318 is rotated more than one-hundred and eighty degrees, either clockwise or counter clockwise (as indicated by arrows R in FIG. 4, so that the entire peripheral edge of substrate 212 is scanned by sensing devices 317A, 317B. This will allow one of the two sensing devices 317A, 317B to detect the substrate fiducial 220 (FIG. 3). The fiducial 220 can be detected by the sensing devices 317A, 317B independent of the fiducial 220 location relative to the support pads 320A, 320B of substrate support 319. For example, when sensing devices 317A, 317B are through beam sensors, the fiducial 220 is not masked from the sensor beam because substrate supports 320A, 320B, at least in way of the beam, are transparent to the sensor beam thereby allowing the beam to pass through the support pads 320A, 320B and impinge on the substrate edge to enable sensors 317A, 317B to sense the fiducial.

Upon detecting the substrate alignment feature 220, a suitable indication signal is transmitted from the sensor to a controller (not shown) to register the detection of the substrate alignment feature 220. The substrate 212 is lowered by substrate support 319 onto the sensor head substrate rest pads 316A, 316B thereby transferring the substrate 212 from the substrate support 319 to the rotatable sensor head 318 (See Block 604 in FIG. 8). The end effector 106 may remain below the sensor head rest pads 316A, 316B. The rotatable sensor head 318 rotates substrate 212 to a desired alignment orientation in accordance with instruction from the controller (See Block 605 in FIG. 8). As may be realized, the rotation of the sensor head 318 is significantly faster during the scanning operation in Block 603 of FIG. 8 than it is in the substrate orientation operation in Block 605 of FIG. 8. The increased rotational speed of the sensor head 318 is accomplished, for example, where the sensor head drive system is a multiple speed rotary drive such as multiple speed stepper motor. In alternate embodiments, any suitable drive system may be used. The substrate transporter end effector 106 lifts the substrate 212 off the sensor head rest pads 316A, 316B, grips the substrate 212 and delivers the substrate 212 to be processed further (See Block 606 in FIG. 8). If there is interference between the sensor head support pads 316A, 316B and the end effector 106 when substrate 212 is held by sensor head 318 at its post alignment position so that the end effector 106 pick path is obstructed, the substrate support system 319 can lift substrate 212 from the sensor head support pads 316A, 316B. Support system 319 has rest pads 320A, 320B that are positioned to clear the sensor head support pads 316A, 316B in the event that the sensor head support pads 316A, 316B block the pick path of the end effector. Further, as seen in FIG. 5, the support system rest pads 320A, 320B are positioned as to not interfere or obstruct end effector 106 motion along Axis Z. Accordingly, transfer of the substrate 212, post positioning, to the end effector may be accomplished independent of substrate orientation and without rotational repositioning of the substrate. The sensor head moves to its home position.

Figure 6:
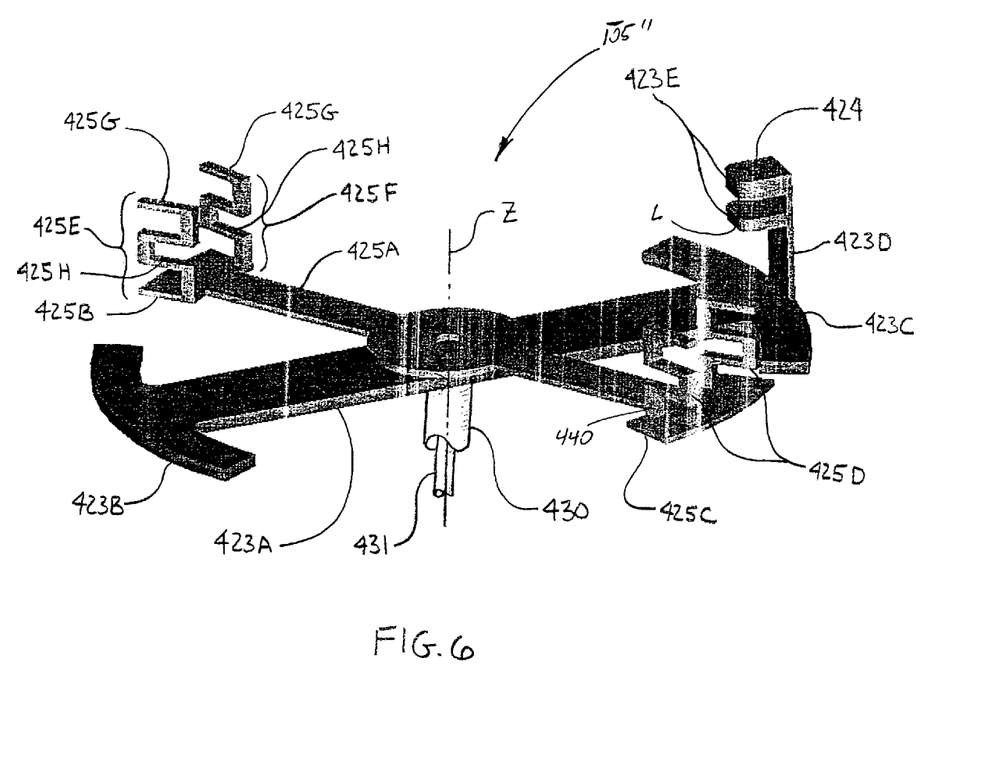
FIG. 6 is a perspective view of a substrate aligner apparatus in accordance with yet another exemplary embodiment of the present invention.

Referring now to FIG. 6, there is shown a perspective view of a substrate aligner apparatus 105" in accordance with another exemplary embodiment. In this embodiment, the substrate aligner apparatus generally comprises a frame (not shown), a rotatable sensor head 423 with sensing device 424 and a rotatable chuck 425 having a buffer system 440 for buffering substrates. The frame in this exemplary embodiment is similar to frame 205 described before and shown in FIGS. 2A-2C unless otherwise noted.

In the embodiment shown in FIG. 6, the rotatable sensor head 423 may be rotatable about Axis Z. The sensor head 423 has a base section 423A mated with a sensor head drive section (of which only a portion of shaft 430 is shown in FIG. 6). The sensor head drive shaft 430 is connected to a sensor head drive system (not shown) as described below. In this embodiment, base member 423A has arms 423B, 423C extending radially from its center of rotation disposed at Axis Z. Base member 423A has an upward extension member 423D depending from one arm 423C of base member 423A. In alternate embodiments both arms may have upward extension members depending therefrom. The upward extension member 423D has cantilever members 423E depending from the upward extension member 423D for supporting the sensing device 424. In this embodiment, the sensing device 424 may be a through beam optical sensor having, for example, a beam transmitter and a beam detector on the cantilevered member 423E. In alternate embodiments, the sensing device may also be a reflective sensor, a capacitive sensor or an inductive sensor. The sensing device 424 is positioned radially from Axis Z at a distance that enables the sensing device 424 to scan the peripheral edge of substrate 212 and detect the fiducial when substrate 212 is held by the substrate buffering system 425. In this embodiment there is only one sensing device 424 but in alternate embodiments there could be any number of sensing devices. As noted before, the sensor head drive system (not shown) mates to the rotatable sensor head base member 423A through drive shaft 430. The sensor head drive system may be similar to the rotational drive systems in aligners 105, 105' as described before, but with motors for independent rotation of co-axial shafts 430, 431. The sensor head drive system may be located at any suitable location on the frame and provides rotation about Axis Z.

In the exemplary embodiment shown in FIG. 6, chuck 425 is rotatable about Axis Z. The chuck 425 has a base member 425A that is substantially centered with Axis Z and is mated to a chuck drive of which only a portion of shaft 431 is shown in FIG. 6. The drive shaft 431 is co-axial with shaft 430 and rotates about Axis Z. As noted before, the drive section is capable of independent rotation of shafts 430, 431. The base member 425A has arms 425B, 425C extending radially from the center of rotation, Axis Z. Each arm 425B, 425C has a rest pad system 425D depending upwardly therefrom. In this embodiment, each rest pad system 425D has two rest pad extension members 425E, 425F. In alternate embodiments, there may be any number of rest pad extension members. Each rest pad extension member 425E, 425F has a generally stepped shape with horizontal sections 425G, 425H forming rest pads. One set of rest pads 425G form support for substrate 212 being scanned while the other set of rest pads 425H forms buffer 440. In alternate embodiments there may be any number of buffers used. The rest pads 425G, 425H can be active or passive gripping and may be made of transparent or non-transparent material depending on the sensing device being used as described before with reference to pads 320A, 320B shown in FIG. 5. By way of example, in this embodiment, rest pads 425G, 425H may be made of quartz or other suitable material transparent to light beam L generated by sensor 424. The rest pads 425G, 425H are at a radial distance from Axis Z, sufficient to hold substrate 212 on its bottom peripheral edge while at the same time allowing the edge of substrate 212 to be scanned by the sensing device 424. The rest pads 425G, 425H and the cantilever members 423E of the sensor head are vertically spaced to allow a substrate transporter end effector 106 to access the rest pads 425G in order to pick or place a substrate on the rest pads. The rest pad extension members 425D do not rotationally interfere with the cantilever members 423E. Rest pads 425G are positioned to pass between cantilever members 423E. Rest pads 425H are positioned to pass under the lower most cantilever member 423E.

Figure 9:
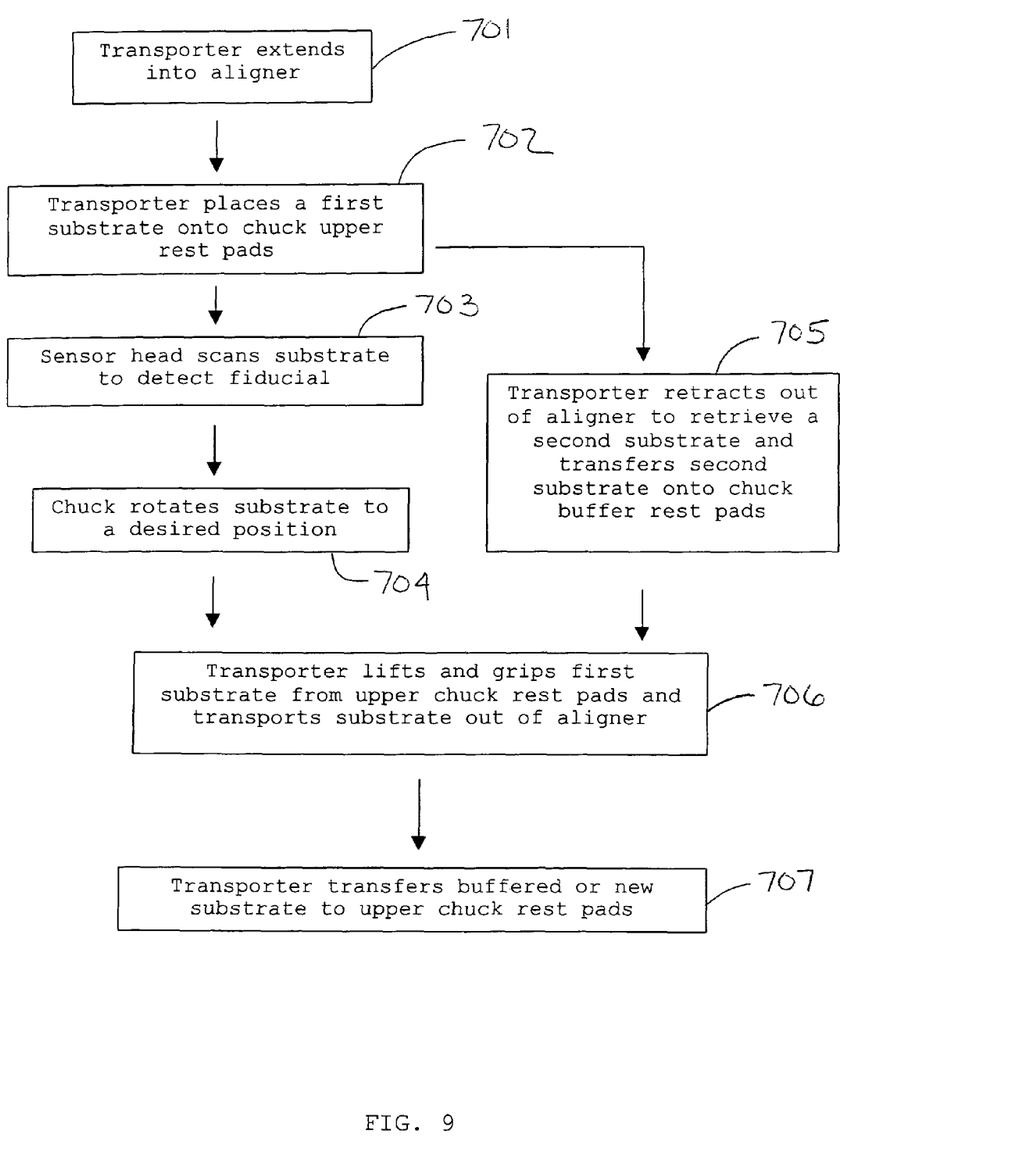
FIG. 9 is a flow chart showing a method for aligning a substrate in accordance with the aligner apparatus in FIG. 6, and FIGS. 10A-10C are schematic elevation views respectively showing an aligning apparatus, in accordance with still yet another embodiment, in three different positions.

Referring still to FIG. 6 and the flow chart in FIG. 9, an exemplary operation manner of the substrate aligner apparatus 105" will be described. A substrate transporter with a single end effector such as those described in U.S. Pat. No. 5,765,983 and U.S. Pat. No. 5,577,879, both of which are incorporated herein by reference in their entirety, may be used with this exemplary embodiment. The substrate transporter end effector 106 (FIG. 1) enters the aligner above the chuck or buffering system rest pads 425G through the frame opening (similar to opening 213 shown in FIG. 2A) and places a first substrate, similar to substrate 212, onto rest pads 425G (See Blocks 701, 702 in FIG. 9). The empty end effector/substrate transporter may retract out of the aligner. It is noted that movements of the empty end effector may be conducted at greater speed than when holding a substrate. If desired, the end effector/substrate transporter may retrieve a second substrate for alignment (See block 705 in FIG. 9). In this embodiment the upper rest pads 425G form scanning rest pads while lower rest pads 425H form buffer rest pads. If desired, in parallel with the transporter retrieving a second substrate, the rotatable sensor head 423, in Block 703 of FIG. 9, is rotated by the sensor head drive shaft 430 to allow the sensing device 424 to detect the fiducial of the first substrate placed on the upper pads 425G.

Sensing device 424 can detect the fiducial independent of its placement on the chuck pads 425G. For example, even if the fiducial is resting on one of the rest pads 425G, the transparent material of the rest pads in way of the sensor through beam leaves the fiducial unmasked or sensable to the beam of the sensor 424. Also, the rest pads 425G grip the substrate on its edges leaving the upper surface of the substrate exposed, allowing, in an embodiment where the sensor is a reflective, capacitive or inductive sensor, fiducial detection without any obstruction from the chuck 425 structure.

When the sensing device 424 detects the substrate alignment feature, a suitable indication signal is transmitted to a controller (not shown) to register the detection of the substrate alignment feature. The chuck 425 then rotates the substrate to a desired alignment orientation (See Block 704 in FIG. 9). As may be realized, rotation of the sensor head 423 to scan the substrate and detect the fiducial may be performed at a much higher rate of rotation than chuck rotation to position the substrate. If desired, The substrate transporter/end effector 106 may enter the frame (See Block 705 in FIG. 9) in the same manner described above at a position above the buffer rest pads 425H to buffer a second substrate on rest pads 425H. The transporter moves an empty end effector (that may be the same end effector having buffered the second substrate or another empty end effector) up to a position between the first and second substrates as they are held in the chuck 425. The end effector moves to a location under the first substrate held on pads 425G and picks the positioned substrate from pads 425G for further processing (See Block 706 in FIG. 9). In block 707 of FIG. 9, the substrate on the buffer pads 425H, or a new substrate if desired, may be placed on the upper pads 425G of the chuck 425. In alternate embodiments the rest pad extension members 425D may be movable to allow vertical movement of the end effector when transferring the buffered substrate to the upper rest pads without the end effector partially retracting out of the aligner. After placement of the second substrate onto pads 425G, the process in Blocks 703-704 is repeated. As may be realized, the buffer on chuck 425 increases the efficiency of the aligner by minimizing transfer times for loading the aligner.

Figure 10A:
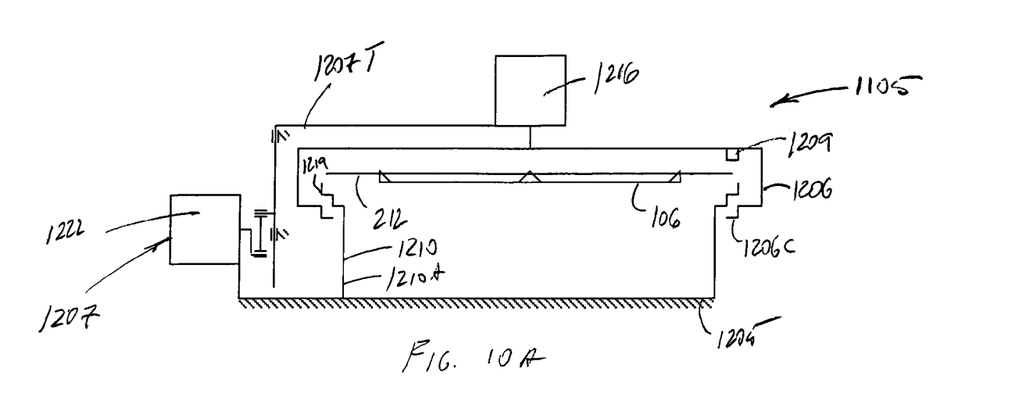
Figure 10B:
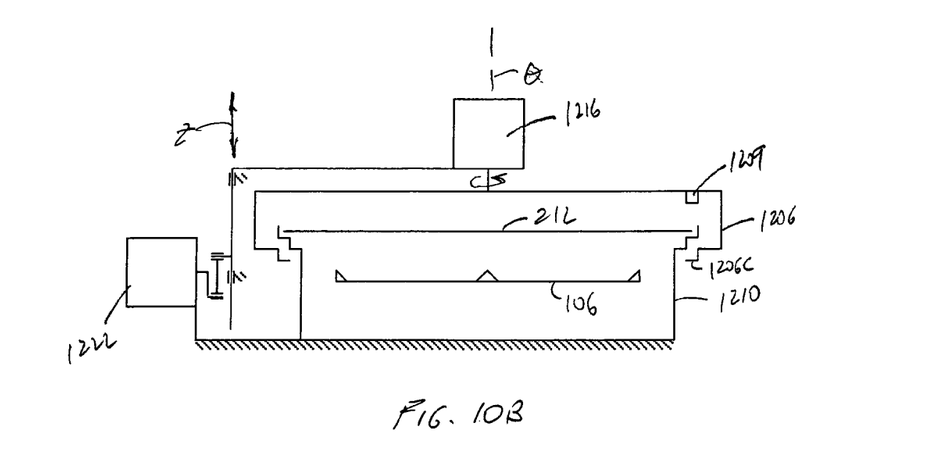
Figure 10C:
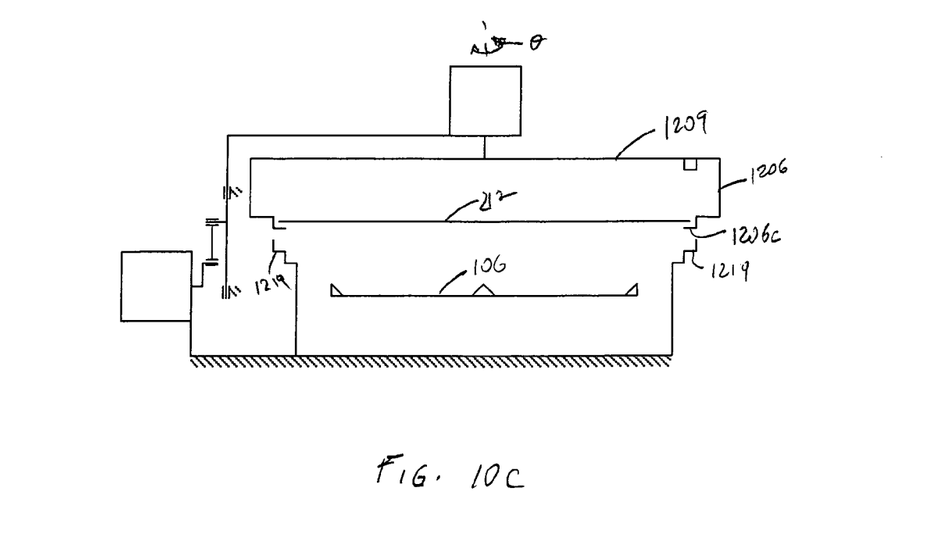

Referring now to FIGS. 10A-10C, there is shown another substrate aligner apparatus 1105 in accordance with still yet another exemplary embodiment. The aligner apparatus 1105 is respectively shown in FIGS. 10A-10C in three different positions. The aligner apparatus 1105 in this exemplary embodiment is generally similar to the aligner apparatus 105 described before and shown in FIGS. 2A-2C, except as otherwise noted. Similar features are thus similarly numbered. Aligner apparatus 1105 has a movable chuck 1206, a sensing device 1209 and a substrate transfer system 1210. The aligner 1105 also has a drive system 1207 powering the movements of the movable chuck 1206. The transfer system 1210 is configured for holding the substrate 2112 in a fixed position inside the aligner. In this embodiment, the substrate transfer system 1210 has members 1210A that are fixed to the aligner frame 1205 in any suitable manner or position. The transfer system members 1210A may have any suitable configuration, and are provided with substrate rest pads 1219 (similar to rest pads 219 shown in FIG. 3). Rest pads 1219, in this embodiment, are not movable but may provide a substrate placement position used when scanning the substrate with sensing device 1209, as will be described further below. Movable chuck 1206, has a general inverted chuck configuration (similar to chuck 206 shown in FIG. 2A-2C). In this embodiment, chuck 1206 is movable both vertically (in the direction indicated by arrow Z in FIG. 10b) and is rotatable about axis or rotation θ. In this embodiment, the drive system 207 has rotatable drive 1216 and linear drive sections 1222 connected by a transfer member 1207T as shown in FIG. 10A. Linear drive 1222, similar to linear drive 222 shown in FIGS. 2A-2C, is operably coupled to transfer member 1207T, and is capable of traversing the transfer member 1207T in the Z direction relative to the aligner frame. The transfer member 1207T may have any suitable shape (the configuration shown in FIGS. 10A-10C is merely exemplary) and may be movably mounted to the aligner frame 1205 in any desired manner to allow relative movement between transfer member and frame in the Z direction. As seen in FIG. 10A, the movable chuck 1206 is mounted to the transfer member 1207T, and thus moves vertically (relative to the frame 1205) in unison with the transfer member. Chucking may be rotatably mounted relative to the transfer member 1207T (such as by suitable rotatable bearing or bushing system) so that chuck 1206 may rotate relative to the transfer member and the aligner frame about axis θ. Rotatable chuck 1206 is rotated about axis θ under impetus from rotational drive section 1216 coupled to the chuck 1206 by a suitable rotational drive transmission system (e.g. rotational drive shaft). In this embodiment, rotational drive section 1216 may also be borne by the movable transfer member 1207T. In alternate embodiments, the rotational drive may be mounted to the aligner frame and coupled to the rotatable chuck by a suitable transmission capable of transmitting rotation to the chuck and accommodating linear motion of the chuck relative to the aligner frame. In this embodiment, the sensing device 1209 that is similar to sensing device 209 shown in FIG. 2A-2C) is mounted on chuck 1206 as shown in FIG. 10A. Sensing device 1209 is positioned to sense the peripheral edge of substrate 212, and its fiducial, when the substrate 212 is seated on the rest pads 1219 of transfer system 1210. Sensing device 1219 is capable of detecting the fiducial 220 (see FIG. 3) of the substrate independent of the orientation of the substrate 212 and position of the fiducial relative to rest pads 1219 or any other structure of the transfer system 1210.

In this embodiment, substrate alignment may be in the following exemplary manner. Substrate 212, introduced into the aligner 1105 with end effector 106, may be positioned onto stationary transfer system rest pads 1219 (see FIGS. 10A-10B). Scanning of the substrate 212, for fiducial detection, as well as eccentricity measurements if desired, may be performed by rotating chuck 1206 (about axis θ), thereby rotating the sensor device 1209 relatively to stationary substrate and scanning the entire periphery of the substrate. As seen in FIG. 10B, in this position (i.e. the scanning position) the movable chuck 1206 has a vertical position so that the chucks substrate rest pads 1206C (similar to substrate rest pads 206C described before) are located below the rest pads 1219 of transfer system 1210 supporting the substrate 212 after location of the fiducial 220 is identified, for example as described above by detection with sensor 1209 alignment of the substrate is effected with movable chuck 1206. The chuck 1206 is moved in the Z direction to pick the substrate (from the transfer system rest pads) with the substrate 212 resting on chuck resting pads 1206, now positioned above the resting pads 219 of the transfer system (see FIG. 10C), the chuck is rotated about axis θ to place the substrate in the desired alignment. The end effector 106 may pick the aligned substrate from the rest pads 1206C of the chuck 1206. In the event the post alignment position of the chuck rest pads 1206C present an interference to a direct substrate pick by the end effector from the chuck 1206, the chuck 1206 may be moved to place the substrate on the rest pads 1219 of transfer system 1210 (similar to the position shown in FIG. 10B) the end effector picks the substrate 212 from the transfer system 1210. Thus post alignment substrate transfer to the end effector may be performed without rotational repositioning of the substrate. As seen in FIG. 10A-10C, the end effector may remain extended throughout the alignment process.

The previously described exemplary embodiments of the aligner 105, 105', 105", and 1105 have many advantages over conventional aligners. Some of the advantages of the aligners 105, 105', 105" and 1105 include but are not limited to the following; elimination of robot re-tries in placing the wafer in the aligner. The wafer may be arbitrarily oriented relative to the end effector without the chuck ever being on the pick path of the robot end effector. The wafer may be aligned properly, without robot re-tries, even for the case when the fiducial lies on top of the aligner chuck pads. As described before, the align times of the present invention are significantly shorter than the align times of conventional aligners. The wafer may always be moved by edge contact without rolling or slipping relative to the chuck, therefore yielding minimum particle generation. During the entire wafer alignment process the robot end effector may stay positioned under the aligner and substrate without any mechanical interference during the alignment process. This means that the wafer may be aligned and placed on the robot end effector with one extend and one retract motion from the aligner station. In addition, only one wafer lift is employed in order to allow the wafer to be picked at the desired post-positioning orientation. Multiple vertical moves are eliminated. This yields minimum wafer walking and optimal aligner throughput.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

The invention claimed is:

1. A substrate aligner apparatus comprising:
a frame adapted to allow an edge gripping substrate transporter to transport a substrate to and from the aligner apparatus; and
an edge gripping chuck system connected to the frame, the edge gripping chuck system including
a rotatable edge gripping chuck including substrate supports for stably holding the substrate and at least one sensor located thereon, the at least one sensor being configured to detect a position determining feature of the substrate where the edge gripping chuck including the substrate supports and the at least one sensor are rotatable as a unit on a common axis of rotation, and
a rotationally fixed edge gripping transfer system, the edge gripping chuck system being configured for holding and rotationally positioning the substrate to a predetermined post alignment substrate orientation resulting in the edge gripping chuck system having a corresponding post alignment position relative to the transporter;
wherein the chuck system is configured to effect predetermined post alignment substrate orientation independent of the transporter so that regardless of the predetermined post alignment substrate orientation relative to the transporter and the resultant post alignment edge gripping chuck system position, post alignment transfer of the substrate to the transporter can be effected without rotational repositioning of the substrate.

2. The substrate aligner apparatus of claim 1, wherein the edge gripping chuck system is configured to rotationally position the substrate while the edge gripping substrate transporter is located within the frame.

3. A substrate aligner apparatus comprising:
a frame adapted to allow a substrate transporter to transport a substrate to and from the aligner apparatus;
a rotatable sensor head with substrate supports for stably holding the substrate and at least one sensing device located thereon, the at least one sensing device for detecting a position determining feature of the substrate, the rotatable sensor head being movably connected to the frame by a driveshaft engaged to the rotatable sensor head for moving the rotatable sensor head including the substrate supports and the at least one sensing device relative to the frame as a unit on a common axis of rotation; and
a rotationally fixed substrate support mounted to the frame for supporting the substrate when the position determining feature is detected by the rotatable sensor head;
wherein the substrate support has support pads contacting a peripheral edge of the substrate and the sensing device is capable of detecting the position determining feature independent of the location of the position determining feature relative to the support pads.

4. The apparatus according to claim 3, wherein the rotatable sensor head is configured to allow the substrate transporter to remain within the frame during alignment of the substrate.

5. The apparatus according to claim 3, wherein the rotatable sensor head comprises substrate rest pads.

6. The apparatus according to claim 5, wherein the substrate rest pads are located to contact an edge of the substrate.

7. The apparatus according to claim 3, wherein the at least one sensing device comprises first and second sensing devices, the first sensing device located on an opposite side of the sensor head from the second sensing device.

8. The apparatus according to claim 7, wherein the first and second sensing devices comprise reflective optical sensors.

9. The apparatus according to claim 7, wherein the first and second sensing devices comprise through beam optical sensors, said through beam optical sensors each having a transmitter and a receiver.

10. The apparatus according to claim 3, wherein the substrate support is movably mounted to the frame and is capable of movement relative to the rotatable sensor head along an axis of motion substantially coincident with an axis of rotation of the rotatable sensor head.

11. The apparatus according to claim 10, wherein the support pads are substantially transparent.

* * * * *